[19] United States Patent
Page

[11] 4,429,416
[45] Jan. 31, 1984

[54] MULTISTAGE CASCADE/CASCODE LIMITING IF AMPLIFIER AND METER CIRCUIT

[75] Inventor: Ronald W. Page, Sunnyvale, Calif.

[73] Assignee: National Semiconductor Corporation, Santa Clara, Calif.

[21] Appl. No.: 362,363

[22] Filed: Mar. 26, 1982

[51] Int. Cl.³ .......................... H04B 1/26; H03F 3/45
[52] U.S. Cl. .................................. 455/211; 330/252; 330/257; 330/259; 330/311; 330/2
[58] Field of Search .................. 330/2, 252, 257, 259, 330/311; 455/205, 210, 211

[56] References Cited
U.S. PATENT DOCUMENTS
4,247,949  1/1981  Watanabe et al. .................. 455/154

Primary Examiner—James B. Mullins
Assistant Examiner—Steven J. Muttula
Attorney, Agent, or Firm—Gail W. Woodward; Paul J. Winters; Michael J. Pollock

[57] ABSTRACT

A plurality of differential amplifier stages in cascaded in a directly coupled configuration to provide substantial signal gain. The first few stages are cascode coupled to a plural input differential signal combiner which has a single differential output that feeds a full wave differential peak detector. The peak detector therefore has an output that rises as a log function of the signal input. This signal-related voltage is then fed to a differential dc amplifier which in turn drives a meter that indicates the log of the input signal strength. The amplifier cascade is stabilized by a dc feedback loop.

5 Claims, 1 Drawing Figure

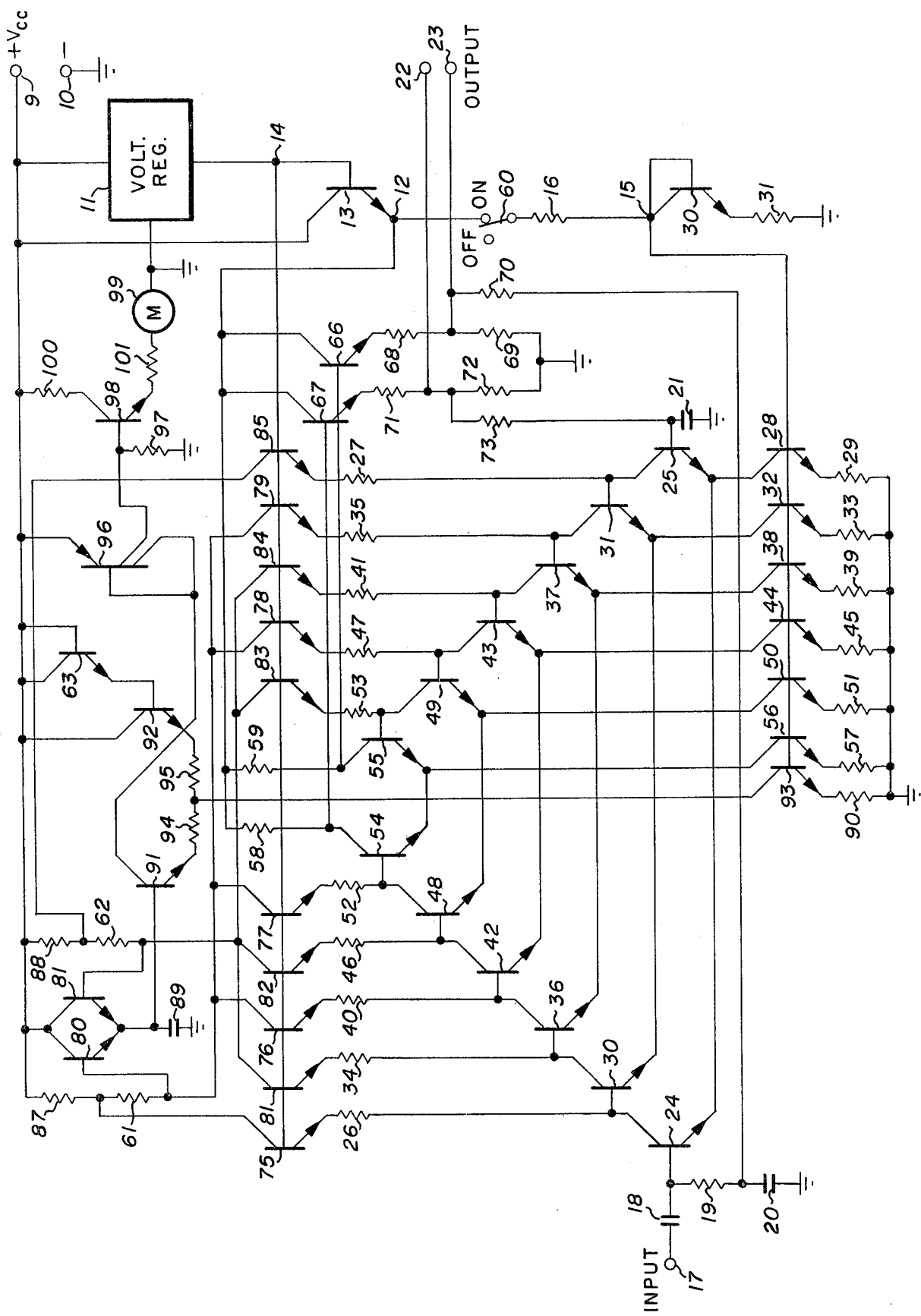

MULTISTAGE CASCADE/CASCODE LIMITING IF AMPLIFIER AND METER CIRCUIT

BACKGROUND OF THE INVENTION

In my U.S. Pat. No. 4,143,331, which was issued Mar. 6, 1979, to the assignee of the present invention, a radio receiver IF amplifier is disclosed along with a signal level meter circuit. This integrated circuit (IC) construction is useful in AM radio receivers that employ an AGC circuit to provide a controlled output. In an FM receiver it is desirable that the IF amplifier acts as a signal limiter at some threshold that is relatively low. Ideally this kind of IF amplifier will limit the output amplitude at an input signal level that approaches the receiver noise limit. While limiting IF amplifiers are known, their operation is ordinarily not very well suited to signal level metering.

SUMMARY OF THE INVENTION

It is an object of the invention to provide an IF amplifier, consisting of a cascade of directly coupled differential amplifier stages, which acts to produce the desired signal limiting and which drives a plural input cascode amplifier that drives a peak detector to produce a signal related voltage.

It is a further object of the invention to provide a high gain limiting amplifier suitable for IC form and including a signal level metering circuit which has a log response to the input signal level.

It is a still further object of the invention to provide a signal limiting amplifier and metering circuit which can be turned on and off by means of a single IC pin and which can be adjusted by a single external component.

These and other objectives are achieved as follows: A plurality of differential amplifier stages, for example six, are directly coupled in cascade to provide a high gain amplifier. An output buffer is directly coupled between output and input to provide negative feedback that stabilizes the dc operating point. The feedback is B03100268/df/km bypassed for the signal frequency so that a high signal gain is available. Each stage of, for example, the first five stages, has its output directly coupled to a plural input cascode differential amplifier that sums the signals. The cascode amplifier drives a full wave peak detector which therefore responds to the log of the input signal. The detector drives a dc amplifier which then operates a meter that has a response related to the log of the input signal.

BRIEF DESCRIPTION OF THE DRAWING

The single FIGURE of drawing is a schematic diagram that shows a six-stage directly coupled cascade of differential amplifiers, a five-stage cascode directly coupled signal combining differential amplifier, a full wave peak detector and dc meter amplifier.

DESCRIPTION OF THE INVENTION

The drawing is a schematic diagram of an FM IF amplifier that is operated from a power supply $V_{CC}$ connected between + terminal 9 and ground terminal 10. The entire circuit is designed to operate at a relatively low voltage such as a 6-volt supply, but can operate as low as 3 volts and up to about 40 volts or whatever the transistor breakdown is for the process being used. An on-chip voltage regulator 11, of conventional design, provides a nominal 3.7 volts at node 14. Transistor 13 provides a nominal 3 volts at node 12. While not shown, nodes 12 and 15 are usually brought out to external pins so that resistor 16 can be external to the IC if desired as will be further developed herinafter. Switch 60 can be used to interrupt the current flowing in resistor 16 to totally turn the circuit off.

The amplifier input terminal 17 is ac coupled to the first stage by capacitor 18. Resistor 19 is a small value resistor, for example 50 ohms, and is selected to set the amplifier signal input impedance. Resistor 19 is bypassed to ground at signal frequency by capacitor 20. Capacitor 21 bypasses the other first stage differential input to ground. Terminals 22 and 23 are the differential output terminals which provide a signal level and bias suitable for directly driving a conventional balanced quad detector (not shown).

Transistors 24 and 25, which comprise the first stage, are differentially connected and are provided with tail current by transistor 28 which includes an emitter resistor 29. Transistor 28 functions as a current mirror with diode connected transistor 30 which passes its current through emitter resistor 31. If resistors 29 and 31 are of equal value, the first stage tail current will be equal to the current flowing in resistor 16. Resistors 26 and 27 act as collector load resistors in the first stage. Normally the first stage is operated at a tail current that provides the best gain versus noise performance.

The second stage, which has its input directly coupled to the first stage output, comprises transistors 30 and 31, tail current source transistor 32 and resistor 33, and load resistors 34 and 35.

The third stage, which is directly coupled in cascade with the second stage, comprises differentially connected transistors 36 and 37, tail current source transistor 38 and resistor 39, and load resistors 40 and 41. This configuration is repeated to create a six-stage amplifier the last stage of which includes transistors 54 and 55 along with load resistors 58 and 59.

The sixth stage output is directly coupled to buffer transistors 66 and 67 which, acting as emitter followers, directly drive output terminals 22 and 23. Resistors 68 and 69 serve as a load for transistor 66 and resistor 70 couples a substantial fraction of the output voltage back to the base of transistor 24 (through resistor 19). Capacitor 20 acts as an ac or signal bypass so the feedback is substantially dc. by virtue of the number of inverting stages in the feedback loop the feedback is negative.

Likewise resistors 71 and 72 act as a load for transistor 67. Resistor 73 feeds a substantial fraction of the output voltage back to the base of transistor 25. Capacitor 21 bypasses the base of transistor 25 for signal frequencies.

From the above it can be seen that a six-stage amplifier is present with dc bias stabilization. Performance-wise such an amplifier can typically display a signal voltage gain of about 4 (which is about 12 db) per stage. This gives an overall gain from terminal 17 to terminals 22–23 of about 72 db.

Transistors 75 through 79 have their collectors coupled to the base of transistor 80. This connects transistors 75–79 as cascode amplifiers which couple alternate stages in the differential cascade to transistor 80. While transistors 76 thru 79 are coupled directly to the base of transistor 80, transistor 75 is tapped down on the divider comprised of resistors 87 and 61. This is done to compensate for the greater current flowing in the first amplifier stage. Similarly transistors 81 through 85 cascode-couple the other transistors in the differential cascade to the base of the transistor 86. Resistors 61, 62, 87 and 88 return the cascode connected transistors to the $V_{CC}$ buss.

It can be seen that the cascode stages couple the first five stages of the cascaded six to transistors 80 and 86 which are connected and driven as a differential peak detector. Capacitor 89 will charge to the peak signal value represented by the cascode amplified sum of the signals present in the first five cascaded differential amplifiers.

The operation of the cascaded differential amplifiers is such that as the input signal rises, the last stage goes into signal limiting first. Then the next to last stage goes into limiting and so on back to the first stage. When the first stage starts to limit, the circuit is regarded as being in full limiting which typically occurs at a signal input level of about one quarter volt peak to peak.

The cascode coupled circuit which has a differential output and five differential inputs is directly coupled to the first five cascaded differential amplifier stages and also acts as the current supply for these stages. Thus the current flowing in resistor 87 constitutes one half of the currents flowing in the first five differential amplifier stages and the current flowing in resistor 88 is the other half of that current. It will be noted that these currents have a signal component in addition to the nominal dc component. Capacitor 89 will charge to the peak positive value of the signal voltages present at the bases of transistors 80 and 86. Thus, as the cascade differential amplifier stages go into limiting, the fifth stage first contributes its signal output to the peak detector, then after the fifth stage starts to limit the fourth stage supplies its added contribution, and so on back to the first stage. Just before the first stage goes into limiting, its peak-to-peak collector voltage swing is about one volt, which when detected will drive the dc voltage across capacitor 89 towards $V_{CC}$.

Transistors 91 and 92 form a differential amplifier which acts as a comparator. Transistor 93 along with resistor 90 determines the tail current in this comparator. The base of transistor 91 is directly coupled to capacitor 89. The base of transistor 92, which constitutes the other comparator input, is held at one diode below $V_{CC}$ by diode connected transistor 63. The comparator response is degenerated by emitter resistors 94 and 95.

Under quiescent conditions the charge on capacitor 89 will be one diode lower than the voltage drop across resistors 87 and 61 or 88 and 62 below $V_{CC}$. Thus, the resistor voltage drops will cock the comparator so that substantially all of the tail current produced by transistor 93 flows in transistor 92. As the signal of terminal 17 rises, the charge on capacitor 89 will rise and an appreciable proportion of the tail current will start to flow in transistor 91. When the voltage at the base of transistor 91 rises to a level one diode below $V_{CC}$, the values of resistors 94 and 95 will determine the sharing of tail current in transistors 91 and 92. Thus the current flowing in transistor 91 is proportional to input signal level and it has a log characteristic because of the sequential limiting action of the first five stages in the cascaded differential amplifiers.

The current flowing in the collector of transistor 91 is applied to the base of transistor 96 which is a dual collector PNP device that is connected as a current mirror. Assuming that the two collectors are equal in transistor 96, the current flowing in the collector of transistor 91 is mirrored in resistor 97. Thus the base voltage of transistor 98 is proportional to signal strength. Transistor 98 acts as a voltage follower to supply current to meter 99. Resistors 100 and 101 act as a current limiter and meter calibration respectively. While a meter is shown, any form of indicator could be employed.

As mentioned above, nodes 12 and 15 can be brought out to external IC pins and resistor 16 incorporated as an external component. This is advantageous from the IC user's standpoint in that it permits him to program the circuit operation. Since the current flowing in resistor 16 sets up the current in transistor 30, it also determines the operating currents in all of the cascaded differential amplifier stages. This includes the cascode stages current which flows in resistors 87 and 88. Thus resistor 16 can be adjusted to set the quiescent voltage across capacitor 89 which in turn sets the threshold of the meter circuit. Alternatively, resistor 16 can be set to optimize or control the noise performance of the signal amplifier so that it can be tailored to operate with other associated radio receiver components. Such programming is quite useful to the designer of a radio receiver.

As an additional benefit it can be seen that if the current in resistor 16 is interrupted by a simple SPST switch 60, the entire circuit can be shut off with a single point control. This greatly simplifies the design of FM-AM type radio receivers.

EXAMPLE

The circuit of the drawing was constructed in conventional PN junction isolated IC form. Capacitors 18, 20 and 21 and resistors 16, 19 and 101 were off chip elements. The NPN transistors were of conventional vertical construction and had Beta values in excess of 50. The following component values were employed:

| COMPONENTS | VALUE | UNITS |
| --- | --- | --- |
| Resistor 16 | 8K | Ohms |
| Capacitors 18, 20, 21 | .01 | Microfarads |
| Resistor 19 | 50 | Ohms |
| Resistors 26, 27, 33 34, 35, 39, 40, 41, 45, 46, 47, 51, 52, 53, 57, 58, 59, 68, 71 | 1K | Ohms |
| Resistor 29 | 205 | Ohms |
| Resistors 69, 72 | 5K | Ohms |
| Resistors 87, 88 | 150 | Ohms |
| Resistors 61, 62 | 400 | Ohms |
| Resistors 70, 73 | 25K | Ohms |
| Capacitor 89 | 5 | Picofarads |
| Resistor 90 | 500 | Ohms |
| Resistor 94 | 100 | Ohms |
| Resistor 95 | 240 | Ohms |
| Resistor 97 | 15K | Ohms |
| Resistor 100 | 300 | Ohms |
| Resistor 101 | 2.3K | Ohms |

Meter 99 was a 0-100 microampere device which gave a log response for increasing input signal up to an input signal level of about 0.25 volt peak to peak. The amplifier had a gain of about 72 db, over the frequency range of about 0.1 MHz to 20 MHz, from terminal 17 to terminals 22 and 23. The threshold of limiting was for an input of about 25 microvolts and this value could be controlled by the value of resistor 16.

The circuit of the invention has been described and a working example given. When a person skilled in the art reads the foregoing, alternatives and equivalents, within the spirit and intent of the invention, will be apparent. For example, while six cascaded differential stages are shown, with cascode amplifiers connected to the first five, other combinations could be employed. Accordingly, it is intended that the scope of the invention be limited only by the following claims.

I claim:

1. An integrated signal amplifier and signal level indicating circuit suitable for use in an FM radio receiver as a limiting IF amplifier and meter driver wherein the signal level indication is independent of the amplifier limiting function, said circuit having a signal input, a differential signal output and a signal level related current output and comprising:

a plurality of directly coupled cascaded differential amplifier stages, each stage including a source of tail current and a pair of load resistors;

means for coupling an input signal to one of input terminals of the first one of said plurality of differential amplifier stages to provide said input;

a differential output buffer stage having an input directly coupled to the last one of said plurality of differential amplifier stages and an output that will provide said differential signal output;

directly coupled negative feedback means connected between said output of said output buffer and the input of said first one of said plurality of differential amplifiers, said negative feedback acting to stabilize the operating biases on all of said plurality of differential amplifiers;

cascode connected differential amplifying means coupled to the early stages of said plurality of differential amplifier stages by way of said load resistors so that a majority thereof are so coupled, said cascode connected differential amplifying means having a differential common output and a plurality of differential inputs individually directly coupled to selected ones of said differential amplifier load resistors;

a differential peak detector having an input directly coupled to said common output of said cascode connected differential amplifier means and a single-ended output that develops a direct current voltage level related to the peak signal level at said input; and a differential meter amplifier having a pair of differential inputs and a current output, wherein one of said inputs is directly coupled to said output of said differential peak detector and the other input is returned to a source of reference potential whereby said current output rises in proportion to the log of said signal level.

2. The circuit of claim 1 wherein said negative feedback means includes a low frequency pass filter.

3. The circuit of claim 1 wherein said directly coupled cascaded differential amplifier stages and said differential meter amplifier all have their tail currents slaved to a common current mirror that can be controlled from a common terminal.

4. The circuit of claim 1 further comprising a current mirror coupled to said current output of said differential meter amplifier and having an output suitable for directly driving a meter circuit.

5. The circuit of claim 4 wherein said meter circuit further comprises a resistor for developing a voltage proportional to the output of said current mirror, a voltage follower, and an indicating meter.

* * * * *